(12) United States Patent
Tabo

(10) Patent No.: US 6,542,959 B2
(45) Date of Patent: Apr. 1, 2003

(54) MEMORY REFRESHING SYSTEM

(75) Inventor: Mitsuo Tabo, Machida (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/842,960

(22) Filed: Apr. 26, 2001

(65) Prior Publication Data

US 2001/0018726 A1 Aug. 30, 2001

Related U.S. Application Data

(62) Division of application No. 09/239,281, filed on Jan. 29, 1999, now Pat. No. 6,275,895, which is a division of application No. 08/763,218, filed on Dec. 10, 1996, now Pat. No. 5,966,125.

(30) Foreign Application Priority Data

May 13, 1996 (JP) .............................. 8-117239

(51) Int. Cl.[7] ............................................. G06F 12/02
(52) U.S. Cl. ............................ 711/106; 711/5; 711/105
(58) Field of Search .......................... 711/5, 106, 105; 365/222, 230.3; 713/324

(56) References Cited

U.S. PATENT DOCUMENTS 5,966,725 A * 10/1999 Tabo ........................ 365/222
6,275,895 B1 * 8/2001 Tabo ........................ 365/222

* cited by examiner

Primary Examiner—Than Nguyen
(74) Attorney, Agent, or Firm—J. Bruce Schelkopf

(57) ABSTRACT

A memory refreshing system that can dynamically execute a self-refresh operation, even though the computer system is in a normal operational mode and can thus save the power consumption, and includes a memory refreshing system, for a memory system including a plurality of memory banks, which comprises a memory refreshing device, provided in each of the memory banks, for performing a refresh operation within a corresponding memory bank by units of rows in response to a refresh request; a first memory refresh controller for supplying a refresh request to the memory system every first time period; a second memory refresh controller, provided for each of the memory banks, for supplying a refresh request to the corresponding memory bank every second time period that is longer than the first time period; a memory access monitor, provided for each of the memory banks, for detecting an access to the corresponding memory bank; a timer, provided for each of the memory banks, for generating a timer output when a first predetermined time has elapsed since a last access to the corresponding memory bank, and cancelling a counted timer value in response to the next access to the corresponding memory bank; and a selector, provided for each of the memory banks, for selecting one of the refresh requests from the first and the second memory refresh control means in accordance with the timer output.

1 Claim, 4 Drawing Sheets

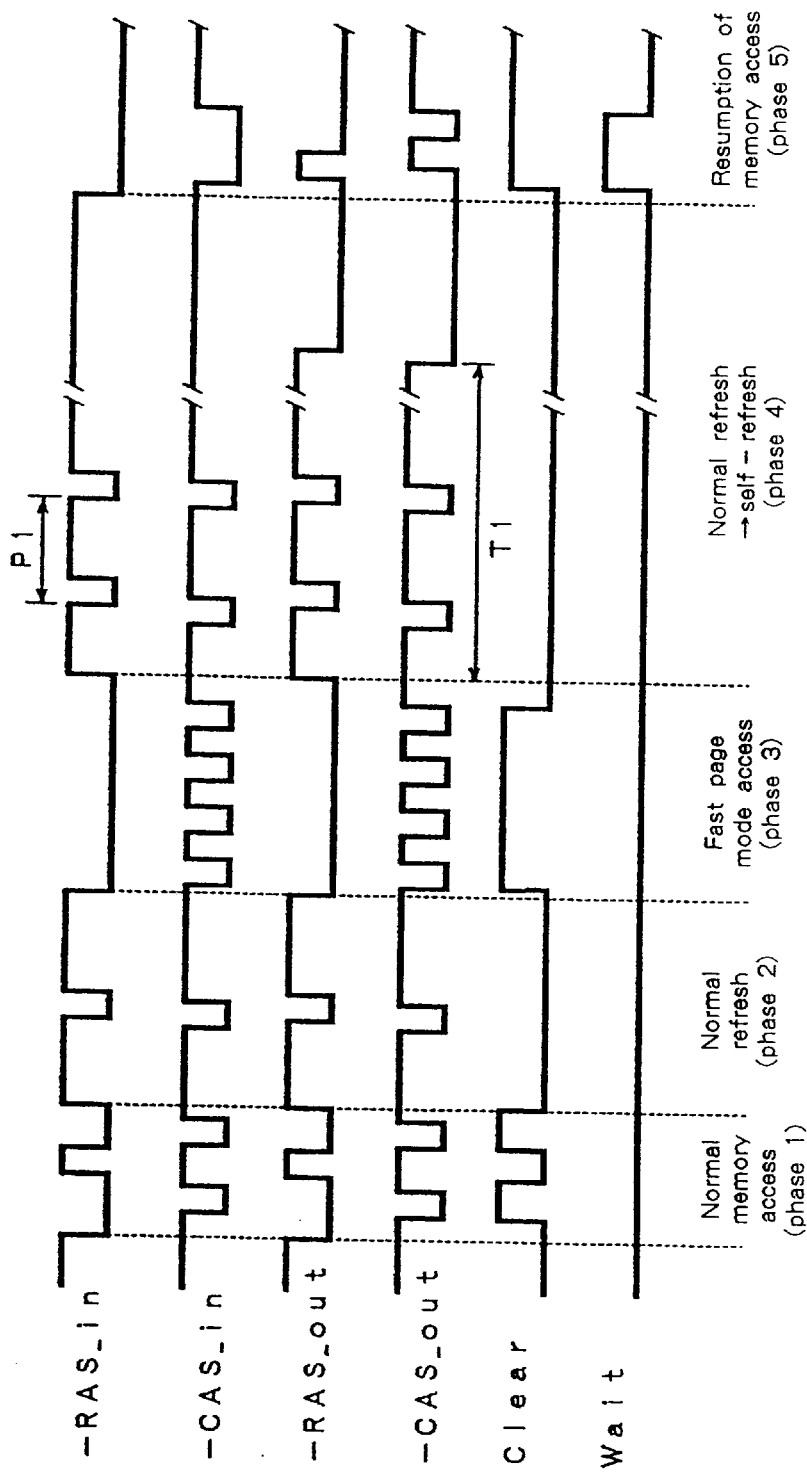

MEMORY REFRESHING SYSTEM

CROSS-REFERENCE TO RELATED APPLICATIONS

This is a divisional application of filed parent application Ser. No. 09/239,281 filed with the United States Patent and Trademark Office on Jan. 29, 1999, now U.S. Pat. No. 6,275,895, which is a divisional of Ser. No. 08/763,218 filed Dec. 10, 1996, now U.S. Pat. No. 5,966,125 issued on Oct. 12, 1999 the teachings of which are incorporated herein by reference.

FIELD OF THE INVENTION

The present invention relates to a memory refreshing system for refreshing a dynamic memory (DRAM), and in particular to a memory refreshing system that executes not only a normal refresh operation between memory access operation by a CPU (central processing unit), but also a self-refresh operation for self-sufficiently refreshing memory banks. More specifically, the present invention pertains to a memory refreshing system that, to reduce the power consumption, dynamically switches between normal refresh and self-refresh operations for memory bank units.

DESCRIPTION OF THE BACKGROUND

In accordance with recent technical developments, various types of personal computers (PCs), such as desktop computers for use in offices and battery-operated notebook computers for use in mobile environments, have been generated and are available on the market.

A basic configuration for these computer systems includes a CPU, which functions as a central controller, and a main memory, to which the CPU accesses. The CPU executes programs loaded on the main memory, and sequentially writes the results obtained by program execution into work areas in banks of the main memory so that the computer processing is performed.

For the main memory, DRAM (dynamic RAM) is generally used because DRAM has a simple cell structure and increasing the capacity of memory composed of DRAM is easier than increasing the capacity of memory composed of SRAM (static RAM), and also because the cost per DRAM memory capacity is generally less than that of SRAM. The DRAM memory cells in the memory are arranged as a matrix. In order to address memory cells individually, first, row addresses and row address strobe (RAS) signals are supplied, and then, column addresses and column address strobe (CAS) signals are supplied.

In the DRAM memory cells, data are capacitively accumulated and stored as individual electric charges. Thus, when data are written to the memory cells and are left for an extended period of time, the charges leak and the stored data are lost. To prevent such data loss, the written data should be refreshed (i.e., re-written) at a predetermined time intervals. A basic refresh operation consists of the accessing to a specific memory cell row to refresh all of the cells along that row. In order to refresh all of the row addresses, a refresh address counter is required that designates refresh addresses sequentially, and means for providing a refresh cycle, or for issuing a refresh request at a predetermined period of time. It should be noted that, in general, a refresh address counter is so designed that it automatically increments a count value upon each refresh cycle.

The following explanation is with regard to RAS-only refresh and CAS-before-RAS refresh. The refresh control methods are, for example, an "RAS-only refresh" method and a "CAS-before-RAS refresh" method. The RAS-only refresh method is one where a refresh operation is controlled by using only row address strobe (RAS) signals. For this method, a refresh address counter that designates refresh row addresses must be provided outside the memory.

The CAS-before-RAS refresh method is one where a refresh request is supplied to the memory by activating a row address strobe (RAS) signal immediately after the transmission of a column address strobe (CAS) signal, i.e., by using the form CAS-before-RAS. Since an RAS signal is always activated first during a common memory access operation, CAS-before-RAS refreshing is possible. According to this method, so long as a refresh address counter is provided inside the memory, refreshing is performed substantially the same as it is by the RAS-only refresh method. In addition, an external address counter is not necessary. Recent DRAM products that have a memory capacity of 256K bits or larger generally include the CAS-before-RAS function.

The following explanation is with regard to normal refreshing and self-refreshing. From the view point of operabonal methods, a refresh control operation can be classified as either a "normal refresh" or "self-refresh" operation. A normal refresh operation, as is indicated by the words, is an operation performed while a computer system is in a normal operation mode, i.e, between memory accesses by the CPU. Since a normal refresh circuit is so designed that it employs a high processing speed, in accordance with the access operation by the CPU, it tends to require a large amount of power consumption. A normal refresh operation is usually performed once every 15 $\mu$sec, with a refresh cycle of 200 to 500 nsec and a power consumption of 100 mA, and the average current used per hour unit is 2 to 5 mA. As this is the power consumed per DRAM chip, and since four to eight DRAM chips are generally mounted in a PC, the total current consumed during a normal refresh operation can be as much as several tens of mA.

On the other hand, self-refreshing has been developed to reduce the current required for refresh operation, and for this operation, the refreshing is performed internally, by a memory device itself. In order to conduct self-refreshing, the memory device requires means for acquiring a refresh cycle at predetermined intervals, and a refresh address counter to designate a refresh address for each refresh cycle.

Since self-refreshing is performed during when the CPU is not accessing to the memory, self-refreshing may be asynchronized with the operation rate of the CPU. The self-refreshing operation requires the use of only a minimum current (200 to 300 $\mu$A) at a longer cycle period so that the data loss in each memory cell can be prevented, self-refreshing can save the power consumption. In addition, as self-refreshing can be performed only inside the memory device, devices other than the memory can be powered down so that the power management effect can be expected. Another aspect bearing on the effectiveness of self-refreshing is that, when viewed from outside the memory, DRAM can be employed as SRAM (as pseudo SRAM) that does not need the refresh operation.

Most computer systems, in which memory backups is taken into consideration, have both the normal refresh function and the self-refresh function. FIG. 6 is a schematic diagram illustrating the arrangement of a computer system that has both the normal refresh function and the self-refresh function. A memory device, and a CPU and an I/O device that provides access to it are connected to each other by a bus. Outside the memory device are provided a normal refresh circuit that performs a relatively fast refresh operation while the CPU is accessing to the memory, and a clock that supplies a relatively short interval signal to the normal refresh circuit. Inside the memory device are provided a self-refresh circuit that performs a relatively slow refresh operation, and an internal clock that supplies a relatively long interval signal to the self-refresh circuit. In addition, a switch is provided to select either the normal refresh circuit or the self-refresh circuit for refreshing the memory device.

The recent memory systems have a plurality of memory banks, for each of which a set of RAS and CAS signals is assigned, and most of the memory system can perform a self-refresh operation for each memory bank. The normal refresh circuit need only transmit a control signal to a memory bank using the CAS-before-RAS method to provide a refresh cycle for the memory bank. Inside the memory bank, an incorporated refresh address counter automatically increments an address upon each refresh cycle. Further, the memory system enters self-refresh mode and activates the incorporated self-refresh function in response to that both the RAS and CAS input to the memory bank are kept in the active state for a predetermined period of time.

The following explanation is with regard to reduction in power consumed for memory refreshing. For battery-operated notebook computers, a reduction in the power consumed is an urgent matter, and is required to extend the battery duration in mobile environments. The power required by such a computer system for memory refreshing can also not be ignored. And as was hereinbefore described, since self-refreshing requires less power than normal refreshing, the use of self-refreshing is desirable whenever possible.

However, as self-refreshing is performed at slow speed asynchronously with the CPU operation, as hereinbefore presented, memory bank access (including both read and write access) is disabled in the self-refresh mode. For the stability of the operation, a common DRAM chip is so constructed that once the entry to the self-refresh mode has been triggered, recovery of the memory bank to the normal refresh mode can not be started unless the memory bank has completely entered to the self-refresh mode. Therefore, a delay time of about 100 $\mu$sec is required for the recovery by the memory bank from the self-refresh mode to the normal refresh mode. When the memory bank is accessed during the recovery period, the transferred data may be damaged or lost, and accordingly, the security of the system operation could be impaired.

Conventionally, therefore, the security of the system operation is regarded as more important than the power management. While a CPU is executing a normal operation, self-refreshing is not conducted and only normal refreshing is performed. More specifically, self-refreshing is employed only during a period wherein the computer system has entered a low power mode, such as a suspended mode, and has completely halted its normal operation. Even when the CPU is accessing only a specific memory bank, the other memory banks that are not being accessed are not switched to the self-refresh mode.

It is therefore one objective of the present invention to further reduce the average current required for an entire computer system by an improved method of reducing the current required for memory refreshing.

It is another objective of the present invention to provide an improved memory refreshing system including, as a feature, not only a normal refresh function for performing refreshing in a normal operational mode, but also a self-refresh function for internally performing memory bank refreshing.

It is an additional objective of the present invention to provide an improved memory refreshing system that can further save the power consumption by dynamically executing in an improved manner a self-refresh operation, even though the computer system is in a normal operational mode.

SUMMARY OF THE INVENTION

To achieve the above objectives and others made obvious by this disclosure, according to a first aspect of the present invention, a memory refreshing system, for a memory system including a plurality of memory banks, comprises: (a) normal refreshing means for executing a memory refresh operation for the memory system; (b) memory access monitoring means, provided for each of the memory banks, for detecting a request to access to a corresponding memory bank; and (c) self-freshing means, provided for each of the memory banks, for, when a predetermined period of time has elapsed since a last access to the corresponding memory bank, suspending the memory refresh operation by the normal refreshing means for the memory bank and performing a self memory refresh operation within the memory bank.

According to a second aspect of the present invention, a memory refreshing system, for a memory system including a plurality of memory banks, comprises: (a) memory refreshing means, provided in each of the memory banks, for performing a refresh operation within a corresponding memory bank by units of rows in response to a refresh request; (b) first memory refresh control means for supplying a refresh request to the memory system every first time period (P1); (c) second memory refresh control means, provided for each of the memory banks, for supplying a refresh request to the corresponding memory bank every second time period (P2) that is longer than the first time period (P1); (d) memory access monitoring means, provided for each of the memory banks, for detecting an access to the corresponding memory bank; (e) a timer, provided for each of the memory banks, for generating a timer output when a first predetermined time (T1) has elapsed since a last access to the corresponding memory bank, and cancelling a counted timer value in response to the next access to the corresponding memory bank; and (f) a selector, provided for each of the memory banks, for selecting one of the refresh requests from the first and the second memory refresh control means in accordance with the timer output.

According to a third aspect of the present invention, a memory refreshing system, for a memory system including a plurality of memory banks, comprises: (a) memory refreshing means, provided for each of the memory banks, for performing a refresh operation within a corresponding memory bank by units of rows in response to a refresh request; (b) first memory refresh control means for supplying a refresh request to the memory system every first time period (P1); (c) second memory refresh control means, provided for each of the memory banks, for supplying a refresh request to the corresponding memory bank every second time period (P2) that is longer than the first time period (P1); (d) memory access monitoring means, provided for each of the memory banks, for detecting an access to the corresponding memory bank; (e) a timer, provided for each of the memory banks, for generating a timer output when a first predetermined time (T1) has elapsed since a last access to the corresponding memory bank, and cancelling a counted timer value in response to the next access to the corresponding memory. bank; (f) a selector, provided for each of the memory banks, for selecting one of the refresh requests from the first and the second memory refresh control means in accordance with the timer output; and (g) a wait request means, provided for each of the memory banks, for, when an access to the corresponding memory bank is. detected while the timer output is active, requesting that an access requester to delay a memory access.

The refresh operation of the first memory refresh control means corresponds to a so-called "normal refresh" operation, and a refresh operation of the second memory refresh means corresponds to a "self-refresh" operation.

In the memory refreshing system as recited in the second and the third aspects, the first memory refresh control means may include means for supplying a refresh request by activating a row address strobe (RAS) signal immediately after transmission of a column address strobe (CAS) signal. This is because CAS-before-RAS memory refreshing has been adopted for many recent memory systems.

In the memory refreshing system as recited in the second and the third aspects, the second memory refresh control means may begin to supply the refresh request in response to that both a received column address strobe (CAS) signal and a received row address strobe (RAS) signal are kept in the active state for a second predetermined time (T2) or longer. This is because many recent self-refreshing functions are so designed as to wake when there is no memory access for a predetermined time period, i.e., when RAS and CAS signals are kept active for a predetermined period of time or longer.

In the memory refreshing system as recited in the second and the third aspect, the memory access monitoring means may include: means for receiving a column address strobe (CAS) signal and a row address strobe (RAS) signal that are transmitted to the corresponding memory bank; means for detecting an access to the corresponding memory bank when the column address strobe (CAS) signal is activated immediately after the row address strobe (RAS) signal; and means that does not detect an access to the corresponding memory bank when the row address strobe (RAS) signal is activated immediately after the column address strobe (CAS) signal. The RAS-before-CAS method is employed for normal memory access, while the CAS-before-RAS method is employed for a refresh request. Taking the switching of a refresh mode into consideration, the normal refresh operation does not need to be regarded in the same manner as is the normal memory access. The memory access monitoring means ignores the CAS-before-RAS request, and as a result, so that the timer counts the time that has elapsed since a last memory access, while excluding the time for the CAS-before-RAS request.

In the memory refreshing system as recited in the second and the third aspects, the selector may include: means for accepting the refresh request from the first memory refresh control means during a period the timer output is inactive; and means for rejecting the refresh request from the first memory refresh control means when the timer output is activated.

In the memory refreshing system as cited in the second and the third aspects, the means for rejecting the refresh request from the first memory refresh control means may include means for activating both the row address strobe (RAS) signal and the column address strobe (CAS) signal to be transmitted to the second memory refresh control means. With this arrangement, the refresh requests from the first and the second memory refresh control means are selectively employed.

Most of the recent memory systems have a plurality of memory banks, for each of which is assigned a set composed of a RAS signal and a CAS signal. Therefore, the memory system can manage a memory access of each memory bank. In the memory refreshing system cited in the above aspects of the present invention, memory accesses by a CPU are monitored for each memory bank. A normal refresh operation is performed continuously for a memory bank that is frequently accessed. On the other hand, for a memory bank that is not accessed during the first predetermined time (T1) or longer, the operation is dynamically switched to a self-refresh mode.

A normal refresh operation is performed in a period between memory access operation by the CPU. A memory refresh request is generally handled prior to a memory access request. Since this access operation is executed in accordance with the operating speed of the CPU, it accordingly requires a large current. On the other hand, a self-refresh operation is performed asynchronously with the operation of the CPU using a minimum current and the slowest cycle at which stored data are not lost, so that self-refreshing is effective in saving the power consumption. According to the present invention, not only in the low-active condition, such as a suspend condition, but also during the normal operation of the computer system, the refresh operation can be dynamically shifted to the self-refresh mode in accordance with the frequency of access to each memory bank. Taking into account the "principle of locality", that teaches a currently executing program frequently accesses only a specific memory area, relatively many memory banks can be switched to the self-refresh mode during normal operation, and the power management performed in accordance with the present invention is highly effective.

In addition, since self-refreshing is asynchronously performed relative to the operation of the CPU, the operational mode must be recovered to the normal refresh mode when the memory access process to a memory bank is resumed, and a certain delay time, as hereinbefore presented in an examplary manner as 100 μsec is required for the recovery to be effected. According to the memory refreshing system in the third aspect, when access of a memory bank in a self-refresh mode is requested, a wait request is issued to the access requester, that is, a memory controller, to delay the start of memory access. Thus, time for recovering to the normal refresh mode is afforded for the memory bank in the self-refresh mode. Although this time constitutes memory access overhead, since once the memory bank is returned to the normal operation mode the accessing of that memory bank will continue for a period of time according to the principle of locality, and another memory bank enters the self-refresh mode by turns. When viewed as a part of the total system operation time, the overhead represented by the recovery time is negligible and can be ignored.

Therefore, according to the memory refreshing system of the present invention, self-refreshing is dynamically performed even during the normal mode, and as a result, a reduction in the power consumption can be realized.

Other objects, features, and advantages of the present invention will become apparent in due course during the detailed description of the embodiment of the present invention, which will be given while referring to the accompanying drawings.

BRIEF DESCRIPTION OF THE DRAWINGS

FIG. 5 is a timing chart showing an example operation by the memory refreshing system according to one embodiment.

DESCRIPTION OF THE PREFERRED EMBODIMENT

Figure 1:
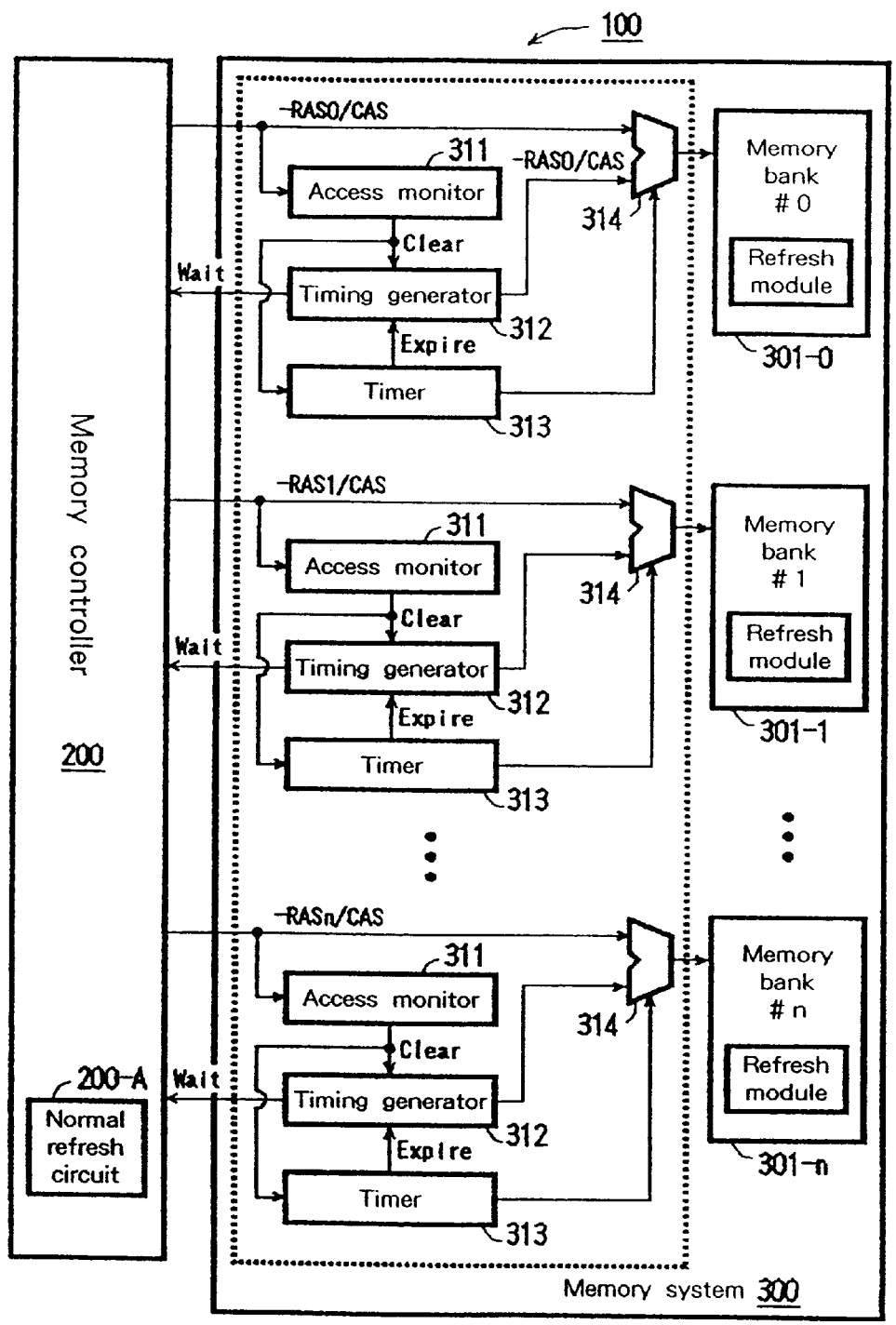
FIG. 1 is a specific diagram illustrating a memory refreshing system that embodies the present invention, together with a memory controller and a memory system.

The preferred embodiment of the present invention will now be described in detail while referring to the drawings.

A. System Configuration

FIG. 1 is a specific diagram illustrating the configuration of a memory refreshing system 100 that embodies the present invention. The memory refreshing system 100 is constructed of a memory controller 200 and a memory system 300.

The memory controller 200 is a dedicated controlling unit that executes memory accesses (including both read accesses and write accesses) of the memory system 300 in response to memory access requests issued by a CPU (not illustrated). The memory Controller 200 has a normal refresh circuit 200-A for performing a so-called normal refresh operation. The normal refresh circuit 200-A has a functional module for providing a normal refresh cycle every predetermined interval (a first time period P1), and supplies a memory refresh request in the CAS-before-RAS form to each memory bank every first time period P1 (normally, about 15 μsec). A -RAS signal and a -CAS signal are output by the memory controller 200 and are selectively supplied via selectors 314 to respective memory banks 301, which will be described later.

The memory controller 200 and the memory system 300 are connected together by a -RAS signal line and a -CAS signal line ("-" indicates an active low signal; the same is applied hereinafter) for instructing the reading of row addresses and the reading of column addresses, a data bus (not illustrated), an address bus (not illustrated), and a control bus (not illustrated). It should be noted that to simplify the drawing, signal lines and hardware components, other than those that are required for the present invention, are not illustrated in FIG. 1.

The memory system 300 has memory banks 301-0, 301-1, . . . 301-n, which constitute the substantial storage media Incorporated in each of the memory banks 301 is a refresh function module. The incorporated refresh function module includes a refresh address counter for incrementing a refresh row address at each refresh cycle, and a controller for, in response to a refresh request, controlling access to a requested row address. The incorporated refresh function module executes both a "normal refresh" operation and a "self-refresh" operation upon the refresh request. A normal refresh operation is realized by responding to a memory refresh request in the CAS-before-RAS form received outside the memory bank (from the normal refresh circuit 200-A), and by accessing a designated row address. A self-refresh operation is begun when both the -RAS signal and the -CAS signal have been kept active, i.e., in the low state, for a second predetermined time (T2) (it should be noted that the -CAS signal falls earlier). In the self-refresh mode, a refresh request is issued every second time period (P2) in accordance with an internal clock (not illustrated), and in response to the refresh request, a designated row address is accessed. Performance of the self-refresh operation proceeds in this manner. Generally, the second time period P2, for the self-refresh cycle, is longer than the first time period P1, for the normal refresh cycle.

A block in the memory system 300 outlined by a broken line denotes a functional module for switching the refresh operation of the memory banks. The block comprises, for each memory bank, a memory access monitor 311 that monitors an access to the corresponding memory bank; a timing generator 312 that activates the self-refresh function in a memory bank at a predetermined condition; a timer 313 that counts the time elapses since a last access to the corresponding memory bank; and a selector 314 that selectively supplies a refresh request to the corresponding memory bank in response to the output of the timer 313. Since the memory access monitor 311, the timing generator 312, the timer 313, and the selector 314 are provided for each memory bank, switching of the normal refresh operation and the self-refresh operation can be performed for each memory bank individually. The respective hardware components will hereafter be described.

Memory Access Monitor

The memory access monitor 311 monitors an access to the corresponding memory bank 301. The monitor 311 is provided so that the memory bank 301 does not enters the self-refresh mode while it is being accessed. Since a normal refresh operation does not have to be regarded as a common memory access, the memory access monitor 311 acknowledges only an RAS-before-CAS request as a memory access and ignores a CAS-before-RAS request.

Figure 2:
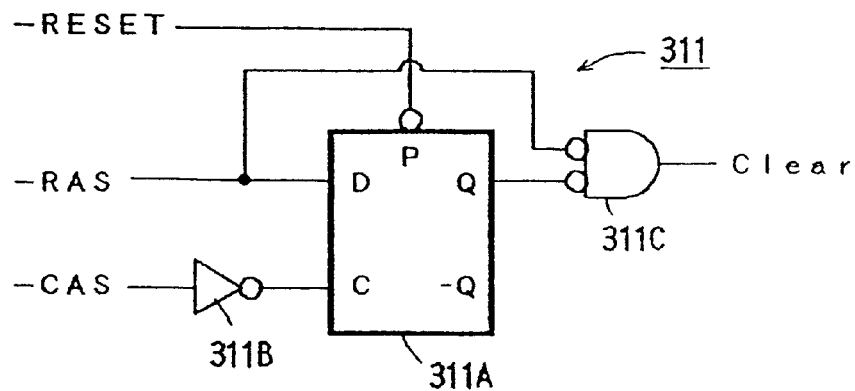
FIG. 2 is a circuit diagram illustrating a memory access monitor.

FIG. 2 is a circuit diagram for the memory access monitor 311. In the memory access monitor 311, as is shown in FIG. 2, a -RAS signal is output by the memory controller 200 to terminal D of a D flip-flop 311A. A -CAS signal is transmitted via a NOT gate 311B to terminal C of the D flip-flop 311A. The inverted output Q of the D flip-flop 311A is input to an input terminal of an AND gate 311C, together with a -RAS signal from the memory controller 200. The output of the AND gate 311C is supplied as a Clear signal, indicating an access to the corresponding memory bank 301. The Clear signal is supplied to both the timing generator 312 and the timer 313.

In accordance with the circuit arrangement shown in FIG. 2, when the -RAS signal is activated (i.e. becomes low) and the -CAS is activated (low) thereafter, the memory access monitor 311 determines that a memory access request has been generated, and generates the Clear output. That is, the Clear signal is kept at a high level for a period extending from the point at which the CAS signal falls, after the RAS signal has fallen, to the point at which the next RAS signal rises. When the -CAS signal is activated (low), and the -RAS signal is activated (low) thereafter, i.e., in the CAS-before-RAS condition, this indicates that a memory refresh request has occurred. The memory access monitor 311 ignores the request and keeps the inactive state of the Clear output.

Timing Generator

The timing generator 312 activates the self-refresh function in the corresponding memory bank 301 at a predetermined condition. The predetermined condition is that equals the first predetermined time T1 has elapsed since a last access to the corresponding memory bank 301, and is detected upon the receipt of an Expire signal from the timer 313, which will be described later. In order to activate the self-refresh function in the memory bank 301, the timing generator 312 continuously keeps a -RAS signal and a -CAS signal active (low) (it should be noted that the -CAS signal falls before the -RAS signal falls). The -RAS output and the -CAS output of the timing generator 312 are selectively supplied to the corresponding memory bank 301 by the selector 314, which will be described later. In addition, when an access to the memory bank 301 is requested again and then the Clear signal is received, the corresponding timing generator 312 outputs a wait signal to the memory controller 200 for a specified time, e.g., 100 µsec as hereinbefore presented). The memory controller 200 does not execute a memory access while receiving a Wait signal, and keeps the wait state. During this wait time, the memory bank 301 can be recovered to the normal refresh mode.

Figure 3:
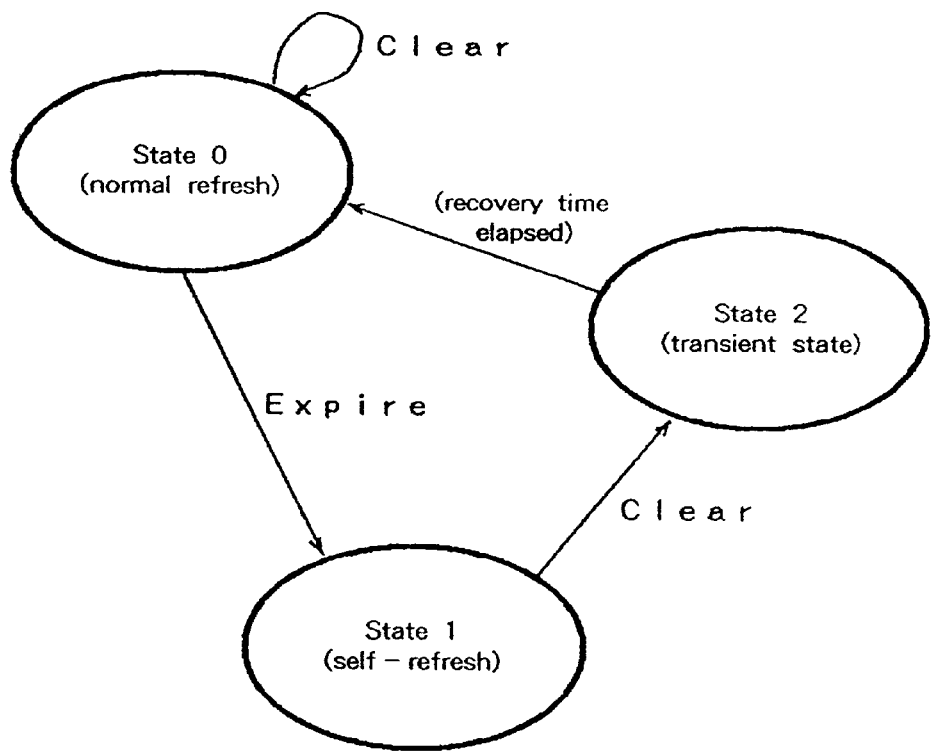
FIG. 3 is a diagram depicting a state machine to explain operational characteristics of a timing generator.

FIG. 3 depicts a state machine that illustrates operational characteristics of the timing generator 312. The timing generator 312 has a "state 0" that means the normal refresh mode, a "state 1" that means the self-refresh mode, and a "state 2" that means the transient state for the recovery to the normal refresh mode.

The state 0 is kept even upon receipt of the Clear signal that indicates a next memory access. However, when the Expire signal is received in response to that the first predetermined time period P1 has elapsed since a last access to the corresponding memory bank, the state is shifted from the state 0 to the state 1.

In the state 1, the active (low) -RAS signal and -CAS signal are continuously output (it should be noted that the -CAS signal falls before the -RAS signal does), so that the self-refresh function in the memory bank 301 is activated. When the Clear signal indicating the next memory access is received, the state is shifted from the state 1 to the state 2.

In the state 2, a Wait signal, that suspends memory access operation by the memory controller 200, is continuously output until the time, as hereinbefore stated, has elapsed required for the recovery of the memory bank 301 from the self-refresh mode to the normal refresh mode. When the necessary time has elapsed, the state is returned from the state 2 to the state 0.

It is possible for the one having the ordinary skill in the art to embody or implement the timing generator according to the state shifting shown in FIG. 3.

Timer

The timer 313 counts the time elapsed since a last access to the corresponding memory bank 301. The timer 313 has a counter C for measuring the time elapsed since a receipt of the Clear signal. As the time elapses, the value held by the counter C is incremented and is reset upon the receipt of the next Clear signal. When the value held by the counter C has reached a predetermined value and the time set for the timer 313 has expired, i.e., when the first predetermined time T1 has elapsed since a last access to the corresponding memory bank 301, the Expire signal is activated.

Figure 4:
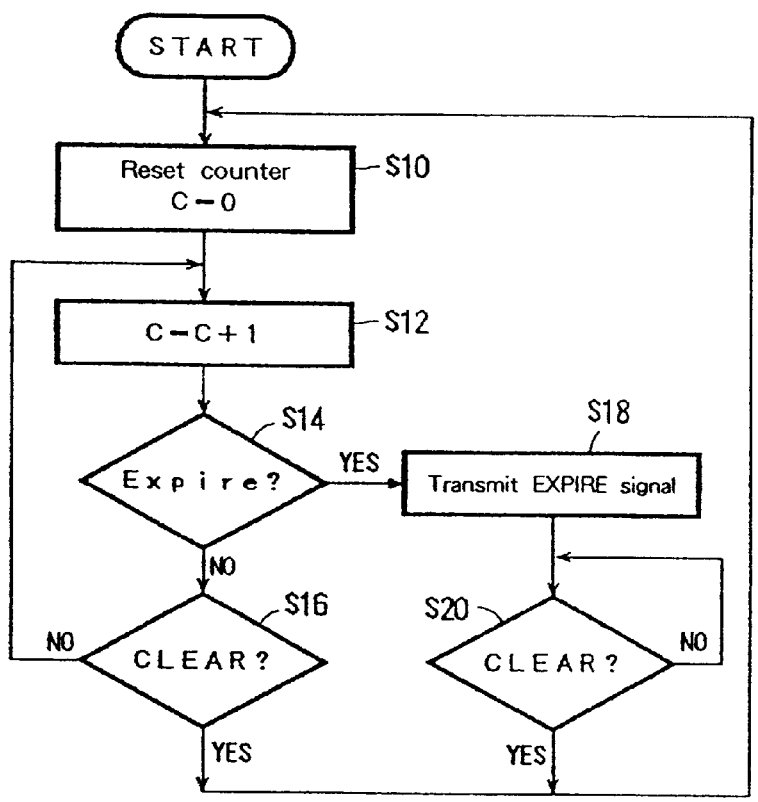
FIG. 4 is a flowchart of the procedure processed by a timer.
Figure 6:
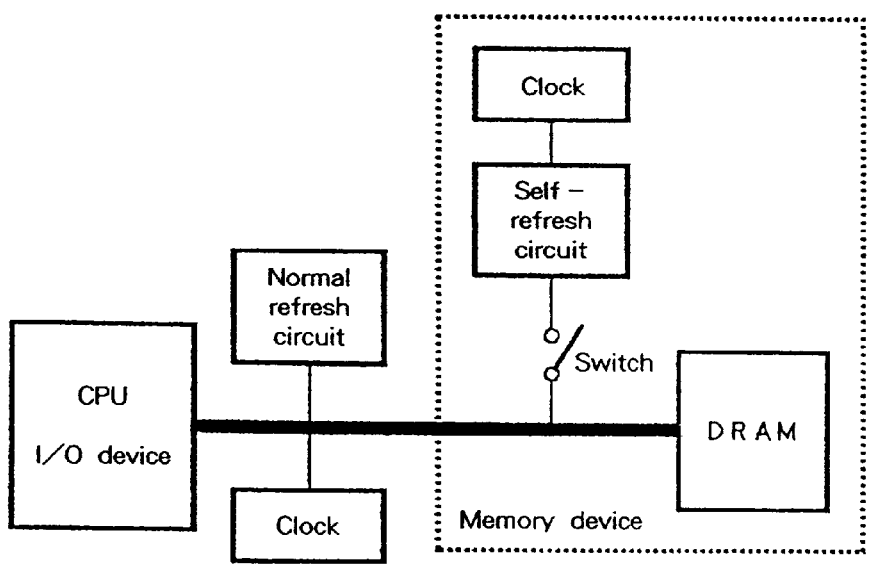
FIG. 6 is a schematic diagram illustrating a system that has both a normal refresh function and a self-refresh function.

FIG. 4 is a flowchart that depicts the procedure processed by the timer 313. First, an initial value, zero, is set for the counter C (step S10), and thereafter the value is incremented at intervals by one (step S12). When the value held by the counter C has not reached a predetermined value and the Clear signal has not been output, program control returns to step S12 and the same process is repeated. When the Clear signal is output, this means that next memory access has occurred. Program control therefore returns to step S10, whereat the value held by the counter C is reset to zero, and the above described process is repeated (step S16).

When the value held by the counter C has reached the predetermined value and the time set for the timer 313 has expired (step S14), program control jumps to step S18 whereat the Expire signal is output, indicating that there has been no memory access for the first predetermined time T1 or longer. In response to this Expire signal, the timing generator 312 and the selector 314 begin predetermined operations. When the next memory access is requested and the Clear signal is output, program control returns to step S10. The value held by the counter C is reset to zero and the above described process is repeated (step S20).

It should be obvious to one having ordinary skill in the art how to program the timer 313 so that its operation corresponds to the flowchart in FIG. 4.

Selector

The selector 314 selectively supplies one of refresh requests to the memory bank 301 in accordance with the output of the timer 313. The detailed operational characteristics of the selector 314 are as follows:

(1) During a period wherein the timer 313 does not output the Expire signal, i.e., before the first predetermined time T1 has elapsed since a last access to the corresponding memory bank 301, the -RAS/-CAS signal from the memory controller 200 is transmitted to the memory bank 301. As a result, a memory refresh request having the CAS-before-RAS form issued by the memory controller 200 is supplied unchanged to the memory bank 301, so that the normal refresh operation is executed.

(2) During a period wherein the timer 313 is outputting the Expire signal, i.e., after the first predetermined time T1 has elapsed since a last access to the corresponding memory bank 301, the -RAS/-CAS signal output by the timing generator 312 is supplied to the memory bank 301. As a result, since a memory refresh request from the memory controller 200 is cut off, and accordingly the normal refresh operation is not performed. At this time, the timing generator 312 keeps the -RAS signal and the -CAS signal in the active state (low), so that the refresh module incorporated in the memory bank executes the self-refresh operation.

According to the above described operational characteristics of the selector 314, during a period before the first predetermined time T1 has elapsed since a last access to the corresponding memory bank 301, i.e., during a period wherein an access to the memory bank 301 could still occur, the memory controller 200 performs a normal refresh operation. After the first predetermined time T1 has elapsed since a last access to the memory bank 301, activation of the self-refresh function in the memory bank 301 is begun. In other words, the normal refresh operation and the self-refresh operation can be dynamically switched for each memory bank, in accordance with the access frequency for each memory bank.

Hereinafter, an RAS signal and a CAS signal output by the memory controller 200 are called an RAS_in and a CAS_in, respectively. An RAS signal and a CAS signal to be supplied to the memory bank 301 are called an RAS_out and a CAS_out, respectively.

B. Memory Refresh Operation

The hardware configuration of the memory system 300 of the present invention has been explained hereinbefore. In this following presentation, the memory refresh operation for the memory system 300 and the processing for the present invention will be described.

FIG. 5 is a timing chart that illustrates an operational example of the memory refreshing system 100 according to this embodiment. In this timing chart are shown five phases: normal memory accessing (phase 1), normal refreshing (phase 2), fast page mode accessing (phase 3), no accessing of the memory bank 301, i.e., entering phase to the self-refresh mode (phase 4), and memory access resumption, i.e., recovering phase to the normal refresh mode (phase 5).

Phase 1

The normal accessing operation is performed by activating -RAS_in and -CAS_in signals in the RAS-before-CAS form once during each access, as was previously described. In response to the RAS_in and CAS_in signals, the memory access monitor 311 keeps the Clear signal high for a period since the time the -CAS signal goes low after the -RAS signal goes low, until the next -RAS signal goes high. When the Clear signal is output and then the value held by the counter C is reset, the selector 314 outputs the -RAS__in and the -CAS__in signals unchanged as the -RAS__out and the -CAS__out signals.

Phase 2

The normal refresh operation is performed in a period between memory accesses. It should be noted that the memory refresh operation is generally performed prior to the memory access operation. For a normal refresh operation, the normal refresh circuit 200-A supplies a refresh request in the CAS-before-RAS form, as was previously described. At this time, since the memory access monitor 311 does not detect a signal for the CAS-before-RAS form, the Clear signal is not output. It should be noted that until the time set for the timer 313 expires, the selector 314 continuously transmits the -RAS__in and the -CAS__in signals unchanged to the memory bank 301.

Phase 3

For the fast page mode accessing, the -RAS__in signal is activated by one memory access and subsequently the -CAS__in is activated at several times. The access cycle is shortened by the sequential accessing of column addresses along the same row address. In this case, the memory access monitor 311 keeps the Clear signal high during a period extending from the time the CAS signal goes low, after the RAS signal goes low, until the next RAS signal goes high. When the Clear signal is output and then the expiration of the time set for the timer 313 is interrupted, the selector 314 outputs the -RAS__in and -CAS__in signals unchanged as -RAS__out and -CAS__out signals.

Phase 4

While access to the corresponding memory bank 301 is suspended, the memory controller 200 issues only a refresh request in the CAS-before-RAS form. The memory access monitor 311, therefore, does not output the Clear signal. Since the selector 314 supplies the unchanged -RAS__in and -CAS__in signals to the memory bank 301 until the time set for the timer 313 has expired, the normal refresh operation is still performed in the memory bank 301.

When the first predetermined time T1 has elapsed since a last memory access, i.e., after the Clear signal has entered the low state, the time set for the timer 313 expires and the Expire signal is output. In response to the Expire signal, the timing generator 312 continuously outputs the active (low) -RAS and -CAS signals. It should be noted that the -CAS signal goes low before the -RAS signal. In response to the Expire signal, the selector 314 transmits the RAS/CAS signals, which are received from the timing generator 312, to the memory bank 301. As a result, in the memory bank 301, the self-refresh function is activated after the second predetermined time T2 has elapsed, and the self-refresh operation is thereafter begun.

Phase 5

The next memory access is occurred during the self-refresh mode, i.e., by the driving of signals by the memory controller 200 in the RAS-before-CAS form, and the memory access monitor 311 outputs the Clear signal. In response to the Clear signal, the timing generator 312 outputs a Wait signal to the memory controller 200 to suspend the memory access operation. The Wait signal is continuously output during a period (see [0015]) required for recovery to the normal refresh mode.

The memory controller 200 begins memory access. At this time, the timer 313 is reset. As a result, the selector 314 outputs the -RAS__in and the -CAS__in signals, which are received from the memory controller 200, to the memory bank 301 unchanged.

The present invention has been described in detail while referring to a specific embodiment. However, it should be obvious to one having ordinary skill in the art that various modifications or revisions of the embodiment are possible within the scope of the present invention. Although in the explanation for this specification, the present invention has been applied to a personal computer, the present invention can be applied to other types of information processors having memories, such as DRAMs, that require refresh operations. That is, although the present invention has been disclosed by using an example, it should not be limited to that example. To fully understand the subject of the present invention, the claims should be referred to.

As is described above, according to the present invention, provided is an excellent memory refreshing system that can dynamically execute a self-refresh operation even though the computer system is in a normal operational mode, and can thus save the power consumption.

According to the present invention, the average current required for the entire system of a computer can be decreased by reducing the current required for memory refreshing. And for a battery operated notebook computer, for example, the battery duration can be extended.

What is claimed is:

1. A memory refreshing system, for a memory system including a plurality of memory banks, comprising:
  (a) memory refreshing means, provided in each of the memory banks, for performing a refresh operation within a corresponding memory bank in response to a refresh request;
  (b) first memory refresh control means for supplying a refresh request to the memory system every first time period (P1);
  (c) memory access monitoring means, provided for each of the memory banks, for detecting an access to the corresponding memory bank;
  (d) a timer, provided for each of the memory banks, for generating a timer output when a first predetermined time (T1), has elapsed since a last access to the corresponding memory bank, and cancelling a counted timer value in response to a next access to the corresponding memory bank;
  (e) second memory refresh control means, provided for each of the memory banks, for supplying a refresh request to the corresponding memory bank after the first predetermined time (T1) that is longer than the first time period (P1); and
  (f) a selector, provided for each of the memory banks, for selecting one of the refresh requests from the first and the second memory refresh control means in accordance with the timer output,
  wherein said system dynamically executes a self-refresh operation and whereby power consumption of a computer operating in a normal mode of operation is reduced by said system.

* * * * *